(12) United States Patent
Ban et al.

(10) Patent No.: US 10,893,640 B2
(45) Date of Patent: Jan. 12, 2021

(54) COMPONENT PICKUP APPARATUS

(71) Applicant: HANWHA PRECISION MACHINERY CO., LTD., Changwon-si (KR)

(72) Inventors: Jong Eok Ban, Changwon-si (KR); Byung Ju Kim, Changwon-si (KR); Sung Ho Jo, Changwon-si (KR); Eun Suk Yoon, Changwon-si (KR)

(73) Assignee: HANWHA PRECISION MACHINERY CO., LTD., Changwon-si (KR)

( * ) Notice: Subject to any disclaimer, the term of this patent is extended or adjusted under 35 U.S.C. 154(b) by 0 days.

(21) Appl. No.: 16/399,112

(22) Filed: Apr. 30, 2019

(65) Prior Publication Data

US 2019/0350113 A1 Nov. 14, 2019

(30) Foreign Application Priority Data

May 9, 2018 (KR) .......................... 10-2018-0053198

(51) Int. Cl.
| | | |
|---|---|---|
| *H05K 13/08* | (2006.01) | |
| *G02B 27/14* | (2006.01) | |
| *H05K 13/04* | (2006.01) | |
| *G02B 27/10* | (2006.01) | |

(52) U.S. Cl.
CPC ....... *H05K 13/0812* (2018.08); *G02B 27/106* (2013.01); *G02B 27/14* (2013.01); *H05K 13/0409* (2018.08); *H05K 13/0411* (2018.08)

(58) Field of Classification Search
None
See application file for complete search history.

(56) References Cited

U.S. PATENT DOCUMENTS 6,727,713 B1* 4/2004 Choi .................. G01N 21/8806
356/237.5
8,319,832 B2 11/2012 Nagata et al.
(Continued)

FOREIGN PATENT DOCUMENTS

JP 2010-61392 A 3/2010
JP 2012-212947 A 11/2012
(Continued)

OTHER PUBLICATIONS

Communication dated Oct. 14, 2019, issued by the Korean Patent Office in counterpart Korean Application No. 10-2018-0053198.

*Primary Examiner* — Rebecca A Volentine
(74) *Attorney, Agent, or Firm* — Sughrue Mion, PLLC

(57) ABSTRACT

A component pickup apparatus includes a component pickup unit including a plurality of nozzles, each of the plurality of nozzles configured to adsorb a component; a light emitter configured to emit light toward the plurality of nozzles; an image splitter configured to receive an image of the plurality of nozzles generated by the light and configured to split the image of the plurality of nozzles into different groups; and an image capturer configured to capture an image outputted from the image splitter. The image splitter is configured to guide a first image of a first group of the plurality of nozzles to a first row of the image capturer and guide a second image of a second group of the plurality of nozzles to a second row of the image capturer.

11 Claims, 3 Drawing Sheets

(56) References Cited

U.S. PATENT DOCUMENTS

| | | | |
|---|---|---|---|
| 2007/0074390 A1* | 4/2007 | Ota | H05K 13/041 |
| | | | 29/833 |
| 2007/0179036 A1* | 8/2007 | Selle | B31B 70/00 |
| | | | 493/189 |
| 2015/0215510 A1* | 7/2015 | Onishi | H05K 13/0452 |
| | | | 348/86 |
| 2018/0376634 A1* | 12/2018 | Onishi | H05K 13/0812 |

FOREIGN PATENT DOCUMENTS

| | | |
|---|---|---|
| JP | 5963500 B2 | 8/2016 |
| KR | 10-0910771 B1 | 8/2009 |
| KR | 10-1557714 B1 | 10/2015 |
| WO | 2013/094124 A1 | 6/2013 |

* cited by examiner

COMPONENT PICKUP APPARATUS

CROSS-REFERENCE TO THE RELATED APPLICATION

This application claims priority under 35 U.S.C § 119 to Korean Patent Application No. 10-2018-0053198, filed on May 9, 2018, in the Korean Intellectual Property Office, the disclosure of which is incorporated herein by reference in its entirety.

BACKGROUND

1. Field

Apparatuses consistent with exemplary embodiments relate to an apparatus, and more particularly, to a component pickup apparatus.

2. Description of the Related Art

A component pickup apparatus is an apparatus which is capable of transferring a component from the exterior of the apparatus. It is very important for such a component pickup apparatus to precisely engage onto the component via suction and to transfer the component to a designated location. When a component pickup apparatus fails to engage with and transfer the component, the component may not be mounted accurately at a designated location per design intent or the component may get damaged.

To mitigate this problem, a position and an orientation of the component may be assessed. To this end, a component pickup apparatus of the related art may include a camera for capturing images of the component for computing/determining the position and the orientation of the component. Alternatively, a component pickup apparatus of the related art may include a sensor for detecting the component to calibrate the position and the orientation of the component.

The component pickup apparatus of the related art as stated above may include a nozzle unit for suctioning and transferring the component. Yet, in another example, the component pickup apparatus of the related art may include a plurality of nozzle units for suctioning and transferring a plurality of components.

When a component pickup apparatus includes a plurality of nozzle units as described above for suctioning, the position and the orientation of the component may be assessed by capturing images of the plurality of nozzle units through a camera as described above. In this case, it is very difficult to obtain a clear image or clear images of the plurality of nozzle units. Also, because the plurality of nozzle units are arranged in a line in the captured image, the component(s) being suctioned onto the plurality of nozzle units may be too small in the captured image, and thus it may be difficult to clearly identify the component(s). Furthermore, when a component pickup apparatus includes a sensor as described above, the sensor needs to separately detect each nozzle unit, and thus an excessive amount of time and operations may be needed.

SUMMARY

One or more exemplary embodiments provide a component pickup apparatus.

Additional aspects will be set forth in part in the description which follows and, in part, will be apparent from the description, or may be learned by practice of the presented exemplary embodiments.

According to an aspect of an exemplary embodiment, there is provided a component pickup apparatus including a component pickup unit comprising a plurality of nozzles, each of the plurality of nozzles configured to adsorb a component; a light emitter configured to emit light toward the plurality of nozzles; an image splitter configured to receive an image of the plurality of nozzles generated by the light and configured to split the image of the plurality of nozzles into different groups; and an image capturer configured to capture an image outputted from the image splitter. The image splitter is configured to guide a first image of a first group of the plurality of nozzles to a first row of the image capturer and guide a second image of a second group of the plurality of nozzles to a second row of the image capturer.

The image splitter may include: a casing; a first reflector arranged in the casing and configured to reflect the image of the plurality of nozzles; a second reflector arranged in the casing and configured to reflect the first image of the first group of the plurality of nozzles reflected by the first reflector; a third reflector arranged in the casing and configured to reflect the second image of the second group of the plurality of nozzles reflected by the first reflector; a fourth reflector configured to guide the first image reflected by the second reflector to the first row of the image capturer; and a fifth reflector configured to guide the second image reflected by the third reflector to the second row of the image capturer.

The second reflector and the third reflector may form angles different from each other with respect to a bottom surface of the casing.

The fourth reflector and the fifth reflector may be arranged at different heights from a bottom surface of the casing.

The casing may be opaque.

According to an aspect of another exemplary embodiment, there is provided a component pickup apparatus including: a plurality of nozzles, each of the plurality of nozzles configured to adsorb a component; a light source configured to emit light toward the plurality of nozzles; and an image splitter configured to split an image of the plurality of nozzles generated by the light into at least two groups and comprising: a first mirror configured to reflect the image of the plurality of nozzles; a second mirror configured to reflect a first image of a first group of the plurality of nozzles reflected by the first mirror; a third mirror configured to reflect a second image of a second group of the plurality of nozzles reflected by the first mirror, the second and third mirrors spaced apart from each other in a first direction; a fourth mirror configured to guide the first image reflected by the second mirror to a first portion of an image capturer; and a fifth mirror configured to guide the second image reflected by the third mirror to a second portion of the image capturer.

The fourth mirror and the fifth mirror may be arranged at different heights in a second direction perpendicular to the first direction.

The second mirror and the third mirror may be rotated in an opposite direction of each other with respect to a bottom surface of a casing of the component pickup apparatus.

BRIEF DESCRIPTION OF THE DRAWINGS

The above and/or other aspects of the disclosure will become apparent and more readily appreciated from the following description of the embodiments, taken in conjunction with the accompanying drawings in which.

DETAILED DESCRIPTION

Figure 1:
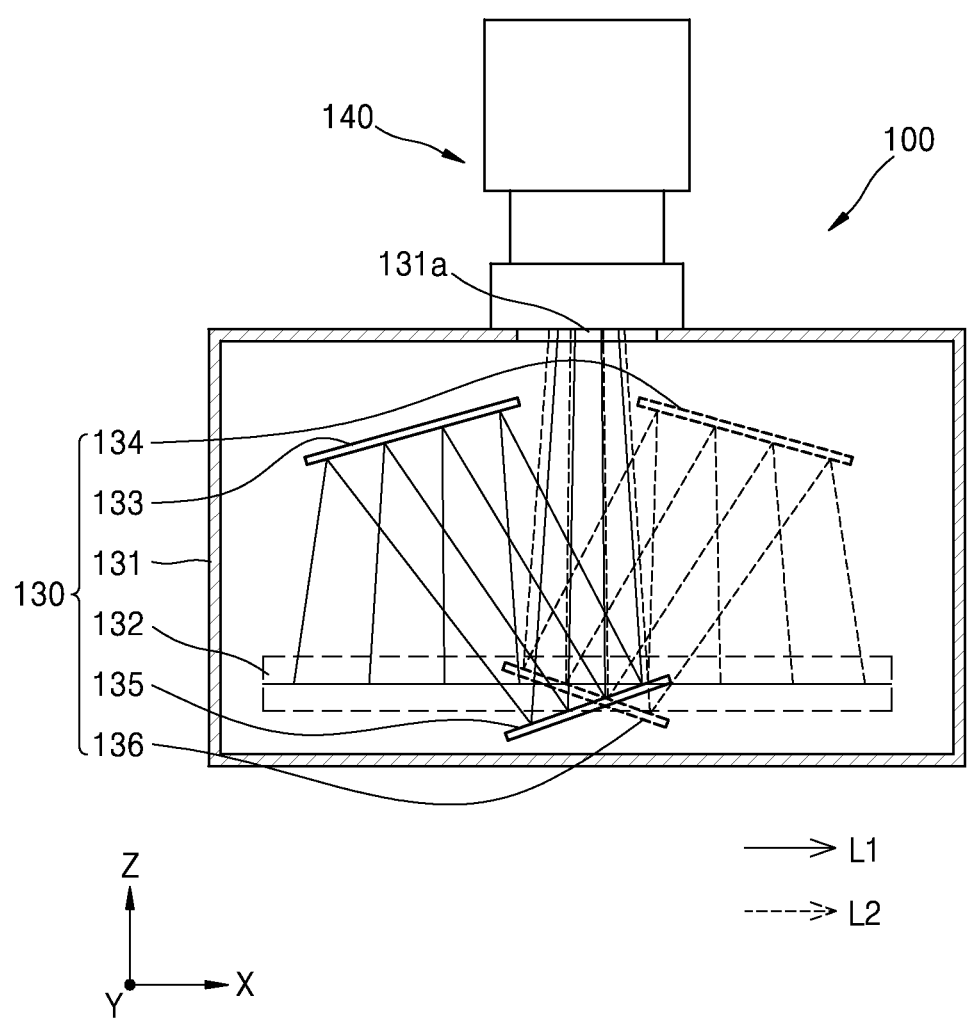
FIG. 1 is a first cross-sectional view of a portion of a component pickup apparatus according to an exemplary embodiment.

Reference will now be made in detail to exemplary embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects of the description. As used herein, the term "and/or" includes any and all combinations of one or more of the associated listed items. Expressions such as "at least one of," when preceding a list of elements, modify the entire list of elements and do not modify the individual elements of the list.

The effects and features of the disclosure and the accompanying methods thereof will become apparent from the following description of the exemplary embodiments, taken in conjunction with the accompanying drawings. Hereinafter, the inventive concepts will be described more fully with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to one of ordinary skill in the art. The terms used in the present specification are merely used to describe particular exemplary embodiments, and are not intended to limit the inventive concepts. An expression used in the singular encompasses the expression of the plural, unless it has a clearly different meaning in the context. In the specification, it is to be understood that the terms such as "comprises" and/or "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. While such terms as "first," "second," etc., may be used to describe various elements, such elements must not be limited to the above terms. The above terms may be used only to distinguish one element from another.

Figure 2:
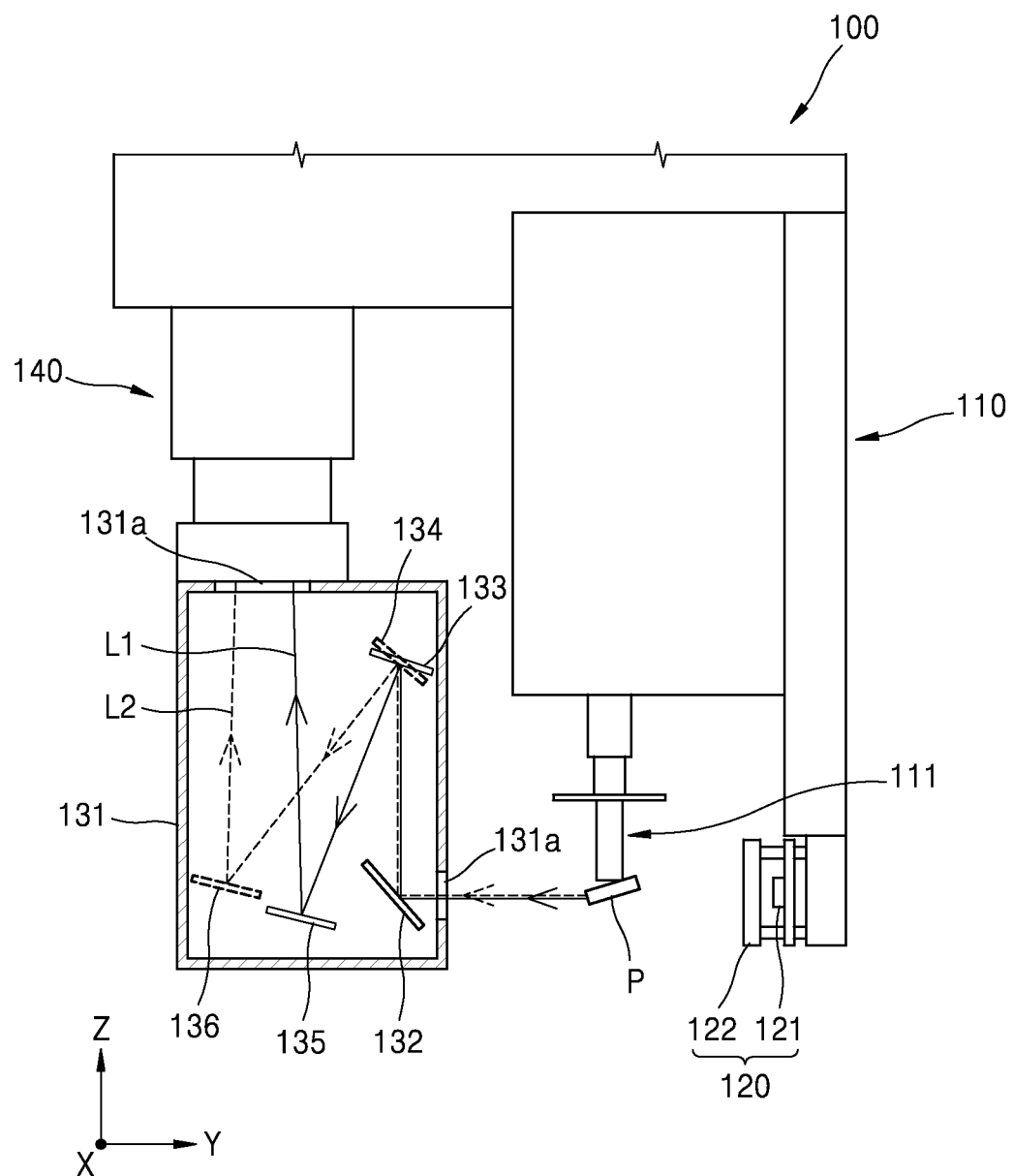
FIG. 2 is a second cross-sectional view of a component pickup apparatus according to an exemplary embodiment.
Figure 3:
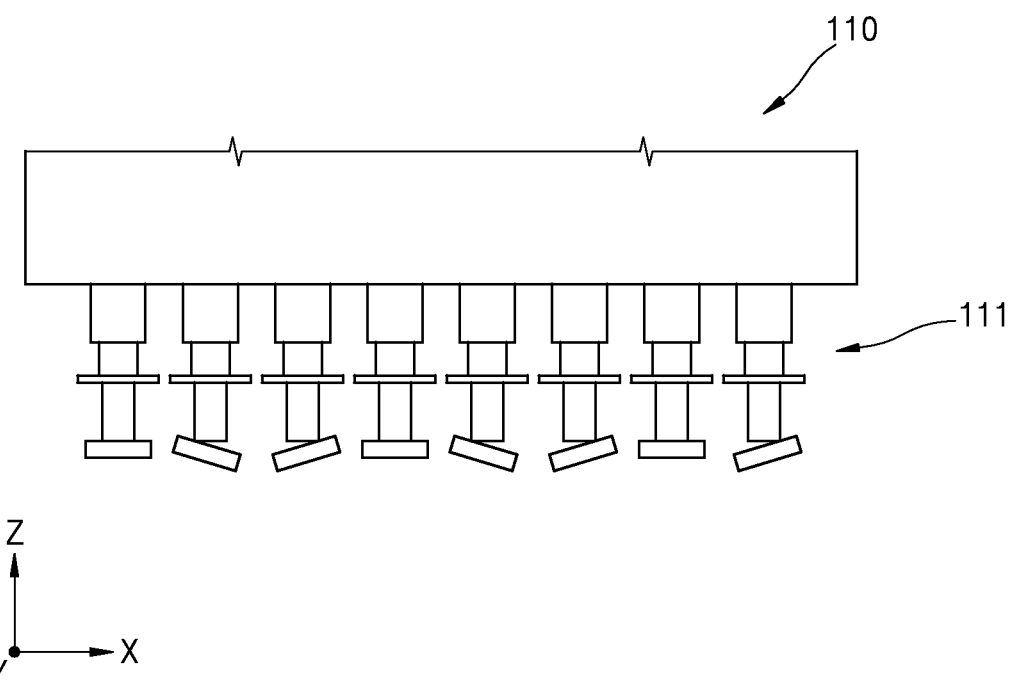
FIG. 3 is a front view of a portion of a component pickup unit of a component pickup apparatus according to an exemplary embodiment.
Figure 4:
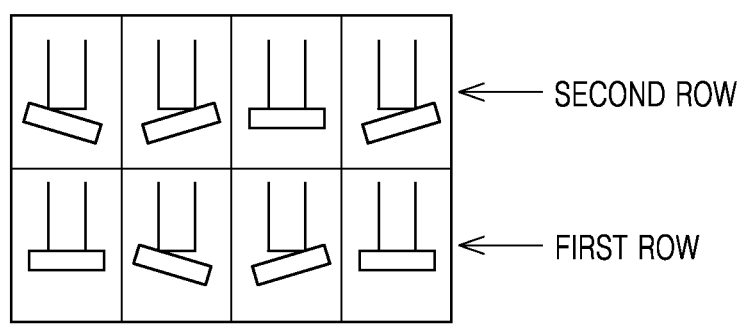
FIG. 4 illustrates an image including a plurality of nozzle units and components captured by an image capturing unit of a component pickup apparatus according to an exemplary embodiment.

FIG. 1 is a first cross-sectional view (in an x-z plane) of a portion of a component pickup apparatus 100 according to an exemplary embodiment. FIG. 2 is a second cross-sectional view (in a y-z plane) of a portion of a component pickup apparatus 100 according to an exemplary embodiment. FIG. 3 is a front view illustrating a portion of a component pickup unit 110 of a component pickup apparatus 100 according to an exemplary embodiment. FIG. 4 illustrating an image including a plurality of nozzle units and components captured by an image capturing unit 140 of a component pickup apparatus 100 according to an exemplary embodiment.

Referring to FIGS. 1 to 4, a component pickup apparatus 100 may include a component pickup unit 110, a light emitter 120 (hereinafter "a light-emitting unit 120"), an image splitter 130 (hereinafter "an image splitting unit 130"), and camera 140 or an image capturer (hereinafter "an image capturing unit 140").

The component pickup unit 110 may include a plurality of nozzles 111 (hereinafter "a plurality of nozzle units 111") for individually suctioning a component P. The plurality of nozzle units 111 may be arranged along a straight line in the X-axis direction of FIG. 1. As the plurality of nozzle units 111 are arranged along a straight line, each nozzle unit 111 of the plurality of nozzle units 111 may engage (i.e., detachably attached) with the component P individually via suction (or adsorption). Each nozzle unit 111 may be engaged with the component P in various manners.

The component pickup unit 110 may include a linear driving unit (not shown) connected to each nozzle unit 111. The linear driving unit may move each nozzle unit 111 linearly. The linear driving unit may be connected to the component pickup unit 110 and linearly move the component pickup unit 110 in at least one direction. Also, the component pickup unit 110 may include a rotation driving unit (not shown) connected to each nozzle unit 111 and drive each nozzle unit 111 to move in a circular path.

The light-emitting unit 120 may be disposed in the component pickup unit 110. The light-emitting unit 120 may emit light toward the plurality of nozzle units 111 and the image splitting unit 130. The light-emitting unit 120 may include a light source 121 disposed in the component pickup unit 110 and include a diffusing plate 122 disposed to be apart from the light source 121. The light source 121 may emit visible rays toward the plurality of nozzle units 111 and the image splitting unit 130. The light source 121 may include an organic light emitting diode or the like and emit white light toward the plurality of nozzle units 111 and the image splitting unit 130. The diffusing plate 122 may be connected to the component pickup unit 110. The diffusing plate 122 may include a translucent material. In this case, the diffusing plate 122 may diffuse light emitted from the light source 121.

The image splitting unit 130 may be disposed to be apart from the light-emitting unit 120. The image splitting unit 130 may split an image of the plurality of nozzle units 111 generated by light emitted from the light-emitting unit 120. For example, when the number of the plurality of nozzle units 111 is eight (8), the image of the eight nozzle units 111 transmitted through the image splitting unit 130 may be divided into two rows, each row including four individual images. Particularly, from among the images of the eight nozzle units 111 transmitted through the image splitting unit 130, the first four may be arranged in a first row and the other four may be arranged in a second row.

The image splitting unit 130 may include a casing 131, a first reflecting unit 132, a second reflecting unit 133, a third reflecting unit 134, a fourth reflecting unit 135, and a fifth reflecting unit 136.

The casing 131 may have a space (a chamber) formed therein and a portion of the casing 131 may be opened to receive the light from the light-emitting unit 120. The casing 131 may be made up of an opaque material. For example, the casing 131 itself may be made up of an opaque material like black plastic, wood, or the like. In another exemplary embodiment, the casing 131 may include different materials, and the outer surface of the casing 131 may be coated with an opaque paint. The light emitted from the light-emitting unit 120 may be incident through the opened portion, and the light transmitted through the image splitting unit 130 may be split and incident on the image capturing unit 140 through another opened portion. A transparent window 131*a* may be disposed in the opened portions. In this case, the transparent window 131*a* may include a transparent material like glass, acryl, or the like. Hereinafter, descriptions will be given in relation to a case where the transparent window 131*a* is disposed in the opened portion of the casing 131 for convenience of explanation.

The first reflecting unit 132 may refract light incident from the light-emitting unit 120. Here, the length (X-axis direction) of the first reflecting unit 132 may be greater than or equal to the distance between the two outermost nozzle units 111 provided at opposite ends of each other. Furthermore, the first reflecting unit 132 may be arranged to be inclined at about 45 degrees with respect to the bottom surface (extending on an X-Y plane) of the casing 131. The first reflecting unit 132 may reflect an image (or shadow) of the plurality of nozzle units 111 generated by the light emitted from the light-emitting unit 120 in a direction (e.g., Z-direction) from the bottom surface of the casing 131 toward the top surface of the casing 131. In the exemplary embodiment, the first reflecting unit 132 may include a mirror. Furthermore, the first reflecting unit 132 may be disposed to be fixed to the inner surface of the casing 131.

The second reflecting unit 133 and the third reflecting unit 134 may reflect the image of the plurality of nozzle units 111 reflected by the first reflecting unit 132 at different angles. In detail, the second reflecting unit 133 and the third reflecting unit 134 may be disposed in the casing 131 to have different angles with respect to the top surface (extending on an X-Y plane) of the casing 131 (or the bottom surface of the casing 131). The second reflecting unit 133 and the third reflecting unit 134 may be disposed inside the casing 131 in an inclined direction opposite to each other. That is, the second reflecting unit 133 and the third reflecting unit 134 may have the same angle with respect to the top or bottom surface (extending on an X-Y plane) but being rotated in the opposite direction (clockwise or counter-clockwise direction) with respect to the top or bottom surface. The second reflecting unit 133 and the third reflecting unit 134 may be disposed to be apart from each other in the lengthwise direction of the casing 131 (e.g., the X direction in FIG. 1). In the exemplary embodiment, the second reflecting unit 133 may reflect a component P of the image of the plurality of nozzle units 111 reflected by the first reflecting unit 132, and the third reflecting unit 134 may reflect another component P of the image of the plurality of nozzle units 111 reflected by the first reflecting unit 132. The second reflecting unit 133 and the third reflecting unit 134 may guide the image of the plurality of nozzle units 111 reflected by the first reflecting unit 132 in two different paths. Particularly, the image of the plurality of nozzle units 111 (and the components P) reflected by the first reflecting unit 132 may be split into two groups by the second reflecting unit 133 and the third reflecting unit 134.

The fourth reflecting unit 135 may be disposed inside the casing 131 and reflect the component P of the image of the plurality of nozzle units 111 reflected by the second reflecting unit 133 to the image capturing unit 140. The fifth reflecting unit 136 may be disposed inside the casing 131 and reflect the component P of the image of the plurality of nozzle units 111 reflected by the third reflecting unit 134 to the image capturing unit 140. The fourth reflecting unit 135 and the fifth reflecting unit 136 may be disposed at the center of the casing 131 in the lengthwise direction (e.g., the X direction in FIG. 1) of the casing 131. In the exemplary embodiment, the fourth reflecting unit 135 and the fifth reflecting unit 136 may be disposed apart from each other in the widthwise direction (e.g., the Y direction in FIG. 2) of the casing 131. Also, the fourth reflecting unit 135 and the fifth reflecting unit 136 may be disposed at different heights with respect to the bottom surface of the casing 131 (e.g., the Z direction in FIGS. 1 and 2). The fourth reflecting unit 135 and the fifth reflecting unit 136 may respectively guide images of the plurality of nozzle units 111 incident from the second reflecting unit 133 and the third reflecting unit 134 to the image capturing unit 140. In the exemplary embodiment, the fourth reflecting unit 135 and the fifth reflecting unit 136 may respectively guide images of the plurality of nozzle units 111 divided by the second reflecting unit 133 and the third reflecting unit 134 to different regions of the image capturing unit 140.

The image capturing unit 140 may capture images reflected by the fourth reflecting unit 135 and the fifth reflecting unit 136. Here, the image capturing unit 140 may include a lens assembly and an image sensor arranged to be apart from the lens assembly. In the exemplary embodiment, an image reflected by the fourth reflecting unit 135 and incident on the image sensor through the lens assembly and an image reflected by the fifth reflecting unit 136 and incident on the image sensor through the lens assembly may be arranged in different rows on the image sensor. For example, images of a first set of the plurality of nozzle units 111 reflected by the fourth reflecting unit 135 may be arranged in a first row of the image sensor. Images of a second set of the plurality of nozzle units 111 reflected by the fifth reflecting unit 136 may be arranged in a second row of the image sensor. At this time, the first row and the second row may be at different positions, and the images of each row may form a straight line as shown in FIG. 4.

The component pickup apparatus 100 described above may be used in various fields. For example, in an exemplary embodiment, the component pickup apparatus 100 may be used in a component mounting apparatus (not shown) for mounting the component P on a substrate. In another exemplary embodiment, the component pickup apparatus 100 may be used in a component transferring apparatus (not shown) for transferring the component P from one region to another region.

Referring to the above-stated operation of the component pickup apparatus 100, the component pickup unit 110 may pick up the component P. Specifically, the linear driving unit may linearly move the pickup unit 110 to move the plurality of nozzle units 111 to a region where the component P is disposed.

When the plurality of nozzle units 111 are arranged above the top surface of the component P, each nozzle unit 111 may linearly move to pick up each component P via suction. Each nozzle unit 111 may include a separate driving unit connected to each nozzle unit 111 for linearly moving each nozzle unit 111.

When the component P is suctioned by each nozzle unit 111, the light source 121 may emit light as described above. The emitted light may be diffused in various directions through the diffusing plate 122. At this time, light passing through the diffusing plate 122 reaches the plurality of nozzle units 111 and the component P suctioned by each nozzle unit 111 and generate images (or shadows) of the plurality of nozzle units 111 and the component P suctioned by each nozzle unit 111.

Such an image may enter the casing 131 through a transparent window 131*a*. At this time, a part of light diffused by the diffusing plate 122 may enter the casing 131 through the transparent window 131*a* together with the image, and the other part of the light diffused by the diffusing plate 122 may be blocked by the casing 131. In such a case, the casing 131 may block not only light diffused by the diffusing plate 122, but also light from external light sources and natural light, thereby preventing the above-described image from being crushed or blurred.

The images (or shadows) incident as described above may be reflected by the first reflecting unit 132 and refracted. At this time, the first reflecting unit 132 may reflect entire images of the plurality of nozzle units 111 and the component P suctioned by each nozzle units 111.

The reflected image may be reflected by the second reflecting unit 133 and the third reflecting unit 134 in different paths, respectively. In particular, an image of a first set of the plurality of nozzle units 111 reflected by the second reflecting unit 133 may be reflected into the first path L1 by the second reflecting unit 133. Also, an image of a second set of the plurality of nozzle units 111 reflected by the third reflecting unit 134 may be reflected into the second path L2 by the third reflecting unit 134. At this time, the second reflecting unit 133 and the third reflecting unit 134 may be arranged to be apart from each other along a lengthwise direction (e.g., the X direction in FIG. 1) as described above. In this case, the first path L1 and the second path L2 do not overlap with each other, and thus an image of the first set of the plurality of nozzle units 111 reflected by the second reflecting unit 133 and an image of the second set of the plurality of nozzle units 111 reflected by the third reflecting unit 134 may not interfere with each other or overlap with each other.

An image of the first set of the plurality of nozzle units 111 reflected by the second reflecting unit 133 may be incident on the fourth reflecting unit 135 along the first path L1. At this time, the fourth reflecting unit 135 may reflect an image of the first set of the plurality of nozzle units 111 to a space between the second reflecting unit 133 and the third reflecting unit 134 along a lengthwise direction (e.g., the X direction in FIG. 1).

An image of the second set of the plurality of nozzle units 111 reflected by the third reflecting unit 134 may be incident on the fifth reflecting unit 136 along the second path L2. At this time, the fifth reflecting unit 136 may reflect the image of the other some of the plurality of nozzle units 111 to a space between the second reflecting unit 133 and the third reflecting unit 134 along a lengthwise direction (e.g., the X direction in FIG. 1).

In this case, an image of the first set of the plurality of nozzle units 111 reflected by the fourth reflecting unit 135 and an image of the second set of the plurality of nozzle units 111 reflected by the fifth reflecting unit 136 may be incident on the image capturing unit 140 while being apart from each other in the widthwise direction (the Y direction) of the casing 131 as shown in FIG. 2.

When an entire image of the plurality of nozzle units 111 is incident on the image capturing unit 140 as described above, an image of first set of the plurality of nozzle units 111 and an image of the second set of the plurality of nozzle units 111 may be incident on different rows of the image sensor of the image capturing unit 140. In this case, the image sensor may distinguish the image of the first set of the plurality of nozzle units 111 and the image of the second set of the plurality of nozzle units 111.

In this case, as shown in FIG. 3, one side of the image sensor may sense an image of a first set of the plurality of nozzle units 111, and the other side of the image sensor may sense an image of a second set of the plurality of nozzle units 111. In this case, a shape detected by the image sensor and displayed on a display panel or the like connected to the image sensor may be as shown in FIG. 3, and a shape recognized by a separate control unit (not shown) connected to the image sensor may also be as shown in FIG. 3.

In such a case, the control unit may determine the position and the orientation of the component P on each nozzle unit 111 based on the image sensed by the image sensor. For example, the control unit may compare a pre-set position and a pre-set orientation of the component P with the position and the orientation of the component P on each nozzle unit 111 and determine whether the position and the orientation of the component P are identical to the pre-set position and the pre-set orientation of the component P. Based on the result, the control unit may linearly move the each nozzle unit 111 to adjust the height of the component P or rotate component P by rotating some of the plurality of nozzle units 111.

After the above operation, light may be emitted from the light-emitting unit 120, images of the plurality of nozzle units 111 and the components P suctioned by the plurality of nozzle units 111 may be captured again by the image capturing unit 140, and the position and orientation of the each component P may be adjusted.

In such a case, the image splitting unit 130 may divide images of the plurality of nozzle units 111 into at least two or more groups (or sets). In detail, to confirm the position and the orientation of a component, an image of each nozzle unit is individually captured or each nozzle unit is detected. Alternatively, an image of a plurality of nozzle units may be captured simultaneously through one image capturing unit. In this case, the plurality of nozzle units may be arranged in a line in a captured image, and some of the plurality of nozzle units may be blurred due to external light or refraction or the image may be too small, and thus it may be difficult to recognize a component.

However, as described above, the component pickup apparatus 100 of the exemplary embodiment may divide images of the plurality of nozzle units 111 and the component P adsorbed to each nozzle unit 111 into a plurality of groups and capture images thereof through the image capturing unit 140, and thus a clear images of each component P may be obtained or each component P may be accurately detected.

The component pickup apparatus 100 of the exemplary embodiment is capable of projecting the plurality of nozzle units 111 onto an image sensor having a limited form.

The component pickup apparatus 100 of the exemplary embodiment may precisely adjust the position and the orientation of the component P by accurately recognizing the position and the orientation of the component P on each of the plurality of nozzle units 111.

According to one or more exemplary embodiments, images of nozzle units may be divided and captured at the same time, and thus clear images of the nozzle units may be captured.

According to one or more exemplary embodiments, the positions and the orientations of components P of nozzle units may be individually confirmed.

According to one or more exemplary embodiments, images of a plurality of nozzle units may be captured by using one image capturing unit, and thus the component pickup apparatus 100 may be installed in a narrow installation space.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While exemplary embodiments have been described above, it will be understood by those of ordinary skill in the art that various changes in form and details may be made therein without departing from the spirit and scope of the disclosure as defined by the following claims.

What is claimed is:

1. A component pickup apparatus comprising:
   a component pickup unit comprising a plurality of nozzles arranged in a same row that extends linearly in a first direction, each of the plurality of nozzles configured to suck a component;
   a light emitter configured to emit light toward side faces of the plurality of nozzles in a second direction that is perpendicular to the first direction;
   an image splitter configured to receive images of the plurality of nozzles, generated by the light, simultaneously, and configured to split the images of the plurality of nozzles into different image groups; and
   an image capturer configured to capture an image outputted from the image splitter,
   wherein the image splitter is configured to guide an image of a first group of the image groups to a first row of the image capturer and guide an image of a second group of the image groups to a second row of the image capturer.

2. The component pickup apparatus of claim 1, wherein the image splitter comprises:
   a casing;
   a first reflector arranged in the casing and configured to reflect the images of the plurality of nozzles;
   a second reflector arranged in the casing and configured to reflect the image of the first group;
   a third reflector arranged in the casing and configured to reflect the image of the second group;
   a fourth reflector configured to guide the image reflected by the second reflector to the first row of the image capturer; and
   a fifth reflector configured to guide the image reflected by the third reflector to the second row of the image capturer.

3. The component pickup apparatus of claim 2, wherein the second reflector and the third reflector form angles different from each other with respect to a bottom surface of the casing.

4. The component pickup apparatus of claim 2, wherein the fourth reflector and the fifth reflector are arranged at different heights from a bottom surface of the casing.

5. The component pickup apparatus of claim 2, wherein the casing is opaque.

6. The component pickup apparatus of claim 1, wherein each image of the image groups includes a same view direction of a respective nozzle of the plurality of nozzles.

7. The component pickup apparatus of claim 6, wherein the same view direction is a side view direction.

8. A component pickup apparatus comprising:
   a plurality of nozzles arranged in a same row that extends linearly in a first direction, each of the plurality of nozzles configured to suck a component;
   a light source configured to emit light toward side faces of the plurality of nozzles in a second direction that is perpendicular to the first direction; and
   an image splitter configured to receive images of the plurality of nozzles, generated by the light, simultaneously, and split the images of the plurality of nozzles into at least two image groups, the image splitter comprising:
   a first mirror configured to reflect the images of the plurality of nozzles;
   a second mirror configured to reflect an image of a first group of the image groups;
   a third mirror configured to reflect an image of a second group of image groups, the second and third mirrors spaced apart from each other in the first direction;
   a fourth mirror configured to guide the image reflected by the second mirror to a first portion of an image capturer; and
   a fifth mirror configured to guide the image reflected by the third mirror to a second portion of the image capturer,
   wherein each image of the at least two image groups includes a same view direction of a respective nozzle of the plurality of nozzles.

9. The component pickup apparatus of claim 8, wherein the fourth mirror and the fifth mirror are arranged at different heights in a third direction perpendicular to the first direction.

10. The component pickup apparatus of claim 8, wherein the second mirror and the third mirror are rotated in an opposite direction of each other with respect to a bottom surface of a casing of the component pickup apparatus.

11. The component pickup apparatus of claim 8, wherein the same view direction is a side view direction.

* * * * *